(12) United States Patent
Kano

(10) Patent No.: US 6,486,490 B1
(45) Date of Patent: *Nov. 26, 2002

(54) LIGHT-EMITTING DEVICE WITH A QUANTUM-WAVE INTERFERENCE LAYER

(75) Inventor: Hiroyuki Kano, Aichi-ken (JP)

(73) Assignee: Canare Electric Co., Ltd., Aichi-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/425,685

(22) Filed: Oct. 22, 1999

(30) Foreign Application Priority Data

Oct. 23, 1998 (JP) .......................................... 10-302835

(51) Int. Cl.$^7$ .............................................. H01L 33/00
(52) U.S. Cl. ............................ 257/13; 257/14; 257/15; 257/17; 257/97
(58) Field of Search ................................. 257/9, 12–15, 257/17, 19–21, 24, 79, 94, 96, 97, 183, 184, 186, 187, 192, 199–201, 431, 438, 461, 613–616

(56) References Cited

U.S. PATENT DOCUMENTS 5,091,756 A  *  2/1992  Iga et al. ........................ 357/4
5,737,350 A  *  4/1998  Motoda et al. ................ 372/45

OTHER PUBLICATIONS

U.S. patent application Ser. No. 09/425,685, filed Oct. 22, 1999, pending.
U.S. patent application Ser. No. 09/915,384, filed Jul. 27, 2001, pending.
U.S. patent application Ser. No. 09/636,081, filed Aug. 11, 2000, pending.
U.S. patent application Ser. No. 09/645,931, filed Aug. 25, 2000, pending.
U.S. patent application Ser. No. 09/648,367, filed Aug. 25, 2000, pending.
U.S. patent application Ser. No. 09/645,932, filed Aug. 25, 2000, pending.
U.S. patent application Ser. No. 09/699,855, filed Sep. 27, 2000, pending.
U.S. patent application Ser. No. 09/688,201, filed Oct. 16, 2000, pending.
U.S. patent application Ser. No. 09/695,312, filed Oct. 25, 2000, pending.

(List continued on next page.)

*Primary Examiner*—Eddie Lee
*Assistant Examiner*—Bradley William Baumeister
(74) *Attorney, Agent, or Firm*—Oblon, Spivak, McClelland, Maier & Neustadt, P.C.

(57) ABSTRACT

An emission layer is formed in a p-layer, and an electron reflecting layer and a hole reflecting layer are formed sandwiching the emission layer. Each of the electron reflecting layer and the hole reflecting layer is constituted by a quantum-wave interference layer with plural periods of a pair of a first layer W and a second layer B. Thicknesses of the first and the second layers in the electron reflecting layer are determined by multiplying by an odd number one fourth of a quantum-wave wavelength of electrons in each of the first and the second layers, and each thicknesses of the first and the second layers in the hole reflecting layer are determined by multiplying by an odd number one fourth of a quantum-wave wavelength of holes in each of the first and the second layers. A luminous efficiency of the LED is improved by electron-hole pairs. The structure in which the emission layer is sandwiched by the electron reflecting layer and the hole reflecting layer is an alternative of a structure in which an i-layer is sandwiched by an n-cladding layer and a p-cladding layer. The emission layer can be formed in a p-layer, and the hole reflecting layer can be formed in an n-layer, an n$^-$-layer or a p$^-$-layer.

7 Claims, 10 Drawing Sheets

OTHER PUBLICATIONS

U.S. patent application Ser. No. 09/057,549, filed Apr. 9, 1998, pending.
U.S. patent application Ser. No. 09/064,222, filed Apr. 22, 1998, pending.
U.S. patent application Ser. No. 09/059,374, filed Apr. 14, 1998, pending.
U.S. patent application Ser. No. 09/245,299, filed Feb. 5, 1999, pending.
U.S. patent application Ser. No. 09/296,743, filed Apr. 23, 1999, pending.
U.S. patent application Ser. No. 09/300,389, filed Apr. 27, 1999, pending.
U.S. patent application Ser. No. 09/320,510, filed May 26, 1999, pending.
U.S. patent application Ser. No. 09/421,221, filed Oct. 20, 1999, pending.
U.S. patent application Ser. No. 09/422,078, filed Oct. 21, 1999, pending.
U.S. patent application Ser. No. 09/425,737, filed Oct. 22, 1999, pending.
U.S. patent application Ser. No. 09/425,735, filed Oct. 22, 1999, pending.
U.S. patent application Ser. No. 09/461,331, filed Dec. 15, 1999, pending.
U.S. patent application Ser. No. 09/461,756, filed Dec. 16, 1999, pending.

* cited by examiner

F I G. 8A
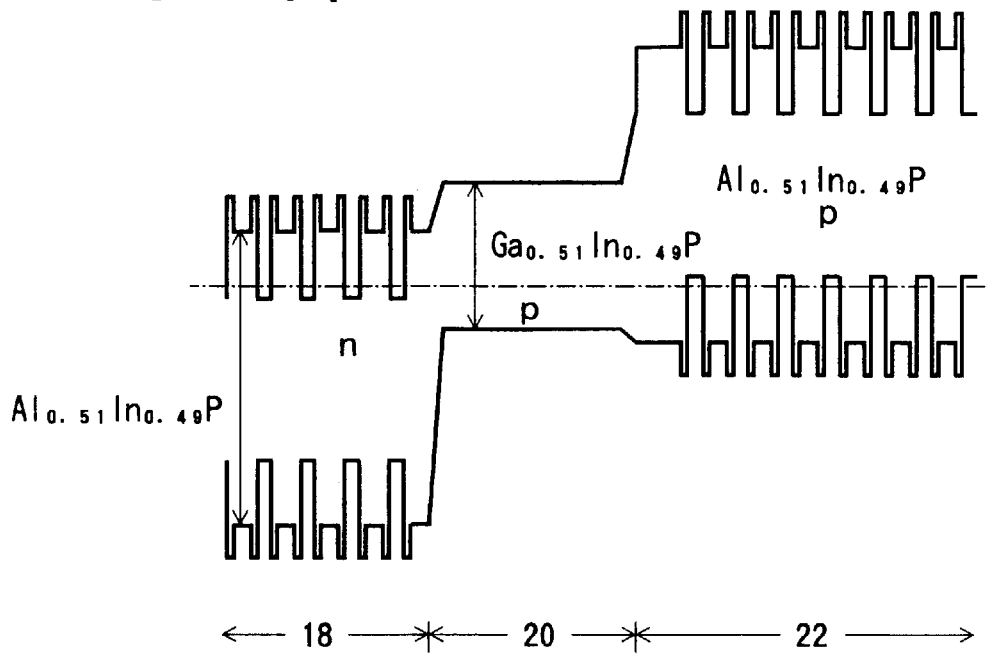
F I G. 8B
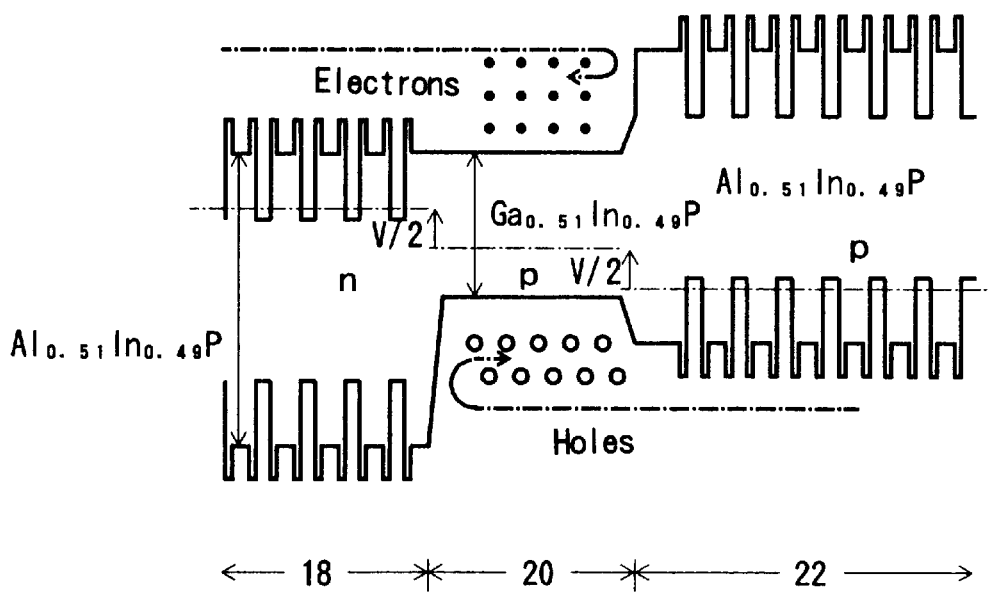

LIGHT-EMITTING DEVICE WITH A QUANTUM-WAVE INTERFERENCE LAYER

BACKGROUND OF THE INVENTION

1. Field of the invention

The present invention relates to a light-emitting device having at least two pairs of a quantum-wave interference layer that effectively reflects carriers, or electrons and holes, respectively. In particular, the invention relates to light-emitting semiconductor devices including a laser (LD) and a light-emitting diode (LED) with improved luminous efficiency by effectively confining carriers with an active layer.

2. Description of the Related Art

An LD has been known to have a double hetero junction structure whose active layer is formed between n-type and p-type cladding layers. The cladding layers function as potential barriers for effectively confining carriers, or electrons and holes, within the active layer.

However, a problem persists in luminous efficiency. Carriers overflow the potential barriers of the cladding layers, which lowers luminous efficiency. Therefore, further improvement has been required, as presently appreciated by the present inventors.

As a countermeasure, forming cladding layers with a multi-quantum well structure of a first and a second layers as a unit to reflect carriers has been suggested by Takagi et al. (Japanese Journal of Applied Physics. Vol.29, No.11, November 1990, pp.L1977–L1980). Although it can be led that a band gap energy is used as an alternative of a kinetic energy, this reference does not teach or suggest values of kinetic energy of carriers to be considered and the degree of luminous intensity improvement is inadequate.

SUMMARY OF THE INVENTION

The inventor of the present invention conducted a series of experiments and, found that the suggested thicknesses of the first and the second layers by Takagi et al. were too small to confine electrons, and that preferable thickness of the first and second layers are 4 to 6 times larger than those suggested by Takagi et al.

Further, the present inventor thought that multiple quantum-wave reflection of carriers might occur by a multi-layer structure with different band width, like multiple light reflection by dielectric multi-film structure. And the inventor thought that it would be possible to confine carriers by the reflection of the quantum-wave. As a result, the inventors invented a preferable quantum-wave interference layer and applications of the same.

It is, therefore, a first object of the present invention to provide an LED in which an emission layer is sandwiched by quantum-wave interference layers with high reflectivity to carriers, functioning as reflecting layers. It is a second object of the present invention is to improve a luminous efficiency of an electron-hole pair by forming an emission layer sandwiched by quantum-wave interference layers in an LED having an emission layer in a p-layer.

In light of these objects a first aspect of the present invention is an LED constituted by two pairs of quantum-wave interference layers Each having plural periods of a pair of a first layer and a second layer as a unit. The second layer has a wider band gap than the first layer. The LED has at least a p-layer and an n-layer, and an emission layer is formed in the p-layer. The emission layer is sandwiched by two pairs of quantum-wave interference layers. Each thicknesses of the first and the second layers in the first quantum-wave interference layer is determined by multiplying by an odd number one fourth of a quantum-wave wavelength of electrons in each of the first and the second layers, and each thicknesses of the first and the second layers in the second quantum-wave interference layer is determined by multiplying by an odd number one fourth of a quantum-wave wavelength of holes in each of the first and the second layers.

The second aspect of the present invention is the LED constituted by the first and the second quantum-wave interference layers each having plural periods of a first layer and a second layer as a unit. Electrons which determine thicknesses of the first and the second layers formed in the first quantum-wave interference layer exists around the lowest energy level of the second layer.

The third aspect of the present invention is the LED constituted by the first and the second quantum-wave interference layers each having plural periods of a first layer and a second layer as a unit. Holes which determine thicknesses of the first and the second layers formed in the second quantum-wave interference layer exists around the lowest energy level of the second layer.

The fourth aspect of the present invention is to define each thicknesses of the first and the second layers in at least one of the first and the second quantum-wave interference layer as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent a Plank's constant, effective mass of carriers in the first layer, effective mass of carriers in the second layer, kinetic energy of carriers at the lowest energy level around the second layer, potential energy of the second layer to the first layer, and odd numbers, respectively.

The fifth aspect of the present invention is an LED having a plurality of partial quantum-wave interference layers $I_k$, formed in at least one of the first and the second quantum-wave interference layer, with arbitrary periods $T_k$ including a first layer having a thickness of $D_{Wk}$ and a second layer having a thickness of $D_{Bk}$ and arranged in series. The thicknesses of the first and the second layers satisfy the formulas:

$$D_{Wk} = n_{Wk} \lambda_{Wk}/4 = n_{Wk} h/4[2m_{Wk}(E_k+V)]^{1/2} \quad (3)$$

and $$D_{Bk} = n_{Bk} \lambda_{Bk}/4 = n_{Bk} h/4(2m_{Bk} E_K)^{1/2} \quad (4)$$

In Eqs. 3 and 4, $E_k$, $M_{Wk}$, $m_{Bk}$, and $n_{Wk}$ and $n_{Bk}$ represent plural kinetic energy levels of carriers flowing into the second layer, effective mass of carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_1$, to $I_j$, where j is a maximum number of k required to form a quantum-wave interference layer as a whole.

The sixth aspect of the present invention is an LED having a plurality of partial quantum-wave interference layers arranged in series with arbitrary periods, formed in at least one of the first and the second quantum-wave interference layer. Each of the plurality of partial quantum-wave interference layers is constructed with serial pairs of the first and second layers. The widths of the first and second layers of the serial pairs are represented by $(D_{W1}, D_{B1}), \ldots, (D_{Wk}, D_{Bk}), \ldots, (D_{Wj}, D_{Bj})$. $(D_{Wk}, D_{Bk})$ is a pair of widths of the first and second layers and is defined as Eqs. 3 and 4, respectively.

The seventh aspect of the present invention is to form a δ layer between a first layer and a second layer which sharply varies the energy band and has a thickness substantially thinner than that of the first and the second layers, in at least one of the first and the second quantum-wave interference layer.

The eighth aspect of the present invention is to use at least one of the first and the second quantum-wave interference layer as a reflecting layer for reflecting carriers.

The ninth aspect of the present invention is to constitute a quantum-wave incident facet in at least one of the first and the quantum-wave interference layer by a second layer with enough thickness for preventing minority carriers from being injected into the first layer by a tunneling effect.

(First to Fourth Aspects of the Present Invention)

The principle of the quantum-wave interference layer of the present invention is explained hereinafter. First, the first quantum-wave interference layer, or an electron reflecting layer which reflects electrons, is explained.

FIG. 1 shows a conduction band of a multi-layer structure with plural periods of a first layer W and a second layer B as a unit. A band gap of the second layer B is wider than that of the first layer W. Electrons conduct from left to right as shown by an arrow in FIG. 1. Among the electrons, those existing around the bottom of the second layer B are likely to contribute to conduction. The electrons around the bottom of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure.

When thicknesses of the first layer W and the second layer B are equal to order of quantum-wave wavelength, electrons tend to have characteristics of a wave. The wave length of the electron quantum-wave is calculated by Eqs. 1 and 2 using kinetic energy of the electron. Further, defining the respective wave number vector in first layer W and second layer B as $K_W$ and $K_B$, reflectivity R of the wave is calculated by:

$$R=(|K_W|-|K_B|)/(|K_W|+|K_B|)$$
$$=[\{m_W(E+V)\}^{1/2}-(m_B E)^{1/2}]/[\{m_W(E+V)\}^{1/2}+(m_B E)^{1/2}]$$
$$=[1-\{m_B E/m_W(E+V)\}^{1/2}]/[1+\{m_B E/m_W(E+V)\}^{1/2}] \quad (5).$$

Further, when $m_B=m_W$, the reflectivity R is calculated by:

$$R=[1-\{E/(E+V)\}^{1/2}]/[1+\{E/(E+V)\}^{1/2}] \quad (6).$$

When $E/(E+V)=x$, Eq. 6 is transformed into:

$$R=(1-x^{1/2})/(1+x^{1/2}) \quad (7).$$

The characteristic of the reflectivity R with respect to energy ratio x obtained by Eq. 7 is shown in FIG. 2.

When the second layer B and the first layer W have S periods, the reflectivity $R_S$ on the incident facet of a quantum-wave is calculated by:

$$R_S=[(1-x^S)/(1+x^S)]^2 \quad (8).$$

When the formula $x \leq \frac{1}{10}$ is satisfied, $R \geq 0.52$. Accordingly, the relation between E and V is satisfied with:

$$E \leq V/9 \quad (9)$$

Since the kinetic energy E of conducting electrons in the second layer B exists around the bottom of the conduction band, the relation of Eq. 9 is satisfied and the reflectivity R at the interface between the second layer B and the first layer W becomes 52% or more. Consequently, the multi-quantum well structure having two kinds of layers with different band gaps to each other enables effective quantum-wave reflection.

Further, utilizing the energy ratio x enables thickness ratio $D_B/D_W$ of the second layer B to the first layer W to be obtained by:

$$D_B/D_W=[m_W/(m_B x)]^{1/2} \quad (10).$$

Thicknesses of the first layer W and the second layer B are determined for selectively reflecting either one of holes and electrons, because of a difference in potential energy between the valence and the conduction bands, and a difference in effective mass of holes and electrons in the first layer W and the second layer B. Namely, the optimum thickness for reflecting electrons is not optimum for reflecting holes. Eqs. 5–10 refer to a structure of the first quantum-wave interference layer for reflecting electrons selectively. The thickness for selectively reflecting electrons is designed based on a difference in potential energy of the conduction band and effective mass of electrons.

Further, the thickness for selectively reflecting holes is designed based on a difference in potential energy of the valence band and effective mass of holes, realizing the second quantum-wave interference layer for reflecting only holes and allowing electrons to pass through.

The electron reflecting layer and the hole reflecting layer as described above function as a p-cladding layer and an n-cladding layer, sandwiching an emission layer which is constituted by an i-layer, respectively. Accordingly, the LED according to the present invention having both the electron reflecting layer and the hole reflecting layer does not necessarily have the emission layer of a conventional LED, which is constituted by an i-layer sandwiched by an n-cladding layer and a p-cladding layer. As a result, the emission layer of the present LED can be constituted by a p-layer or an n-layer. Concerning that a mobility of holes is lower than that of electrons, it is effective to form an emission layer in a p-layer.

(Fifth Aspect of the Present Invention)

As shown in FIG. 3, a plurality of partial quantum-wave interference layers $I_k$ may be formed corresponding to each of a plurality of kinetic energy levels $E_k$. Each of the partial quantum-wave interference layers $I_k$ has $T_k$ periods of a pair of a first layer W and a second layer B whose respective thicknesses $(D_{Wk}, D_{Bk})$ are determined by Eqs. 3 and 4. The plurality of the partial quantum-wave interference layer $I_k$ is arranged in series with respect to the number k of kinetic energy levels $E_k$. That is, the quantum-wave interference layer is formed by a serial connection of $I_1, I_2, \ldots,$ and $I_j$. As shown in FIG. 3, electrons with each of the kinetic energy levels $E_k$ are reflected by the corresponding partial quantum-wave interference layers $I_k$. Accordingly, electrons belonging to each of the kinetic energy levels from $E_1$ to $E_j$ are reflected effectively. By designing the intervals between the kinetic energies to be short, thicknesses of the first layer W and the second layer B ($D_{Wk}$, $D_{Bk}$) in each of the partial quantum-wave interference layers $I_k$ vary continuously with respect to the value k.

(Sixth Aspect of the Present Invention)

As shown in FIG. 4, a plurality of partial quantum-wave interference layers may be formed with an arbitrary period. Each of the partial quantum-wave interference layers, $I_1$, $I_2$, ... is made of serial pairs of the first layer W and the second layer B with widths ($D_{Wk}$, $D_{Bk}$) determined by Eqs. 3 and 4. That is, the partial quantum-wave interference layer, e.g., $I_1$, is constructed with serial layers of width ($D_{W1}$, $D_{B1}$), ($D_{W2}$, $D_{B2}$), ..., ($D_{Wj}$, $D_{Bj}$), as shown. A plurality $I_1$, $I_2$, ... of layers such as layer $I_1$ are connected in series to form the total quantum-wave interference layer. Accordingly, electrons of the plurality of kinetic energy levels $E_k$ are reflected by each pair of layers in each partial quantum-wave interference layers. By designing the intervals between kinetic energies to be short, thicknesses of the pair of the first layer W and the second layer B ($D_{Wk}$, $D_{Bk}$) in a certain partial quantum-wave interference layer varies continuously with respect to the value k.

(Seventh Aspect of the Present Invention)

The seventh aspect of the present invention are directed forming a δ layer at the interface between the first layer W and the second layer B. The δ layer has a relatively thinner thickness than both of the first layer W and the second layer B and sharply varies an energy band. Reflectivity R of the interfaces is determined by Eq. 7. By forming the δ layer, the potential energy V of an energy band becomes larger and the value x of Eq. 7 becomes smaller. Accordingly, the reflectivity R becomes larger.

Also, by sharply varying the band gap of the interfaces, the potential energy V of an energy band becomes larger substantially and the value x of Eq. 7 becomes smaller.

The reason why the reflectivity becomes larger can be considered as follows. Although the first layer W and the second layer B are formed so as to have the energy level as shown in FIG. 6A, actually some of the source gases to form one layer are mixed with other gases to form the other layer, when the layer to form is switched from one layer to the other. Then the energy level of the two layers does not change critically as shown in FIG. 6B. Accordingly, the first layer W and the second layer B, each having the different band width from that designed as in FIG. 6A, are formed. So, as shown in FIG. 6C, when a δ layer which has a adequately thinner thickness than both of the first layer W and the second layer B and sharply varies an energy band is formed, the quantum-wave interference layer is considered to have the energy level as shown in FIG. 6D even if the source gases are mixed. Consequently, as illustrated in FIG. 6D, the energy level of the quantum-wave interference layer, in which a δ layer is formed at the interface between the first layer W and the second layer B, can be close to the ideal energy level shown in FIG. 6A which is not obtained in the case of no δ layer. Because the δ layers shown in FIG. 6D are substantially thin, a tunnel conduction can be expected in the δ layer. Although the δ layer sharply varies the energy band, motion of carriers may hardly be affected by that.

Variations are shown in FIGS. 5A to 5D. The δ layer may be formed on both ends of the every first layer W as shown in FIGS. 5A to 5C. In FIG. 5A, the δ layers are formed so that an energy level higher than that of the second layer B may be formed. In FIG. 5B, the δ layers are formed so that an energy level lower than that of the first layer W may be formed. In FIG. 5C, the δ layers are formed so that the energy level higher than that of the second layer B and the energy level lower than that of the first layer W may be formed. As an alternative to each of the variations shown in FIGS. 5A to 5C, the δ layer can be formed on one end of the every first layer W as shown in FIG. 5D.

Forming one δ layer realizes large quantum-wave reflectivity at the interface between the first layer W and the second layer B. And forming a plurality of the δ layers realizes a larger reflectivity as a whole.

(Eighth Aspect of the Present Invention)

The eighth aspect of the present invention is directed to a quantum-wave interference layer that functions as a reflecting layer and selectively confines carriers in the front of reflecting layer. As mentioned above, the quantum-wave interference layer can be designed to confine either electrons or holes selectively. Accordingly, by forming two kinds of quantum-wave interference layers each of which functions as an electron reflecting layer and a hole reflecting layer, respectively, both electrons and holes can be accumulated in the layer between the two kinds of the quantum-wave interference layers.

(Ninth Aspect of the Present Invention)

The ninth aspect of the present invention is to form a thick second layer $B_0$ at the side of an incident plane of the quantum-wave interference layer, in order to prevent conduction by tunneling effects effectively and to reflect carriers.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIGS. 8A and 8B are views showing energy diagrams of the LED in Examples 1 and 2;

DETAILED DESCRIPTION OF THE PREFERRED EMBODIMENTS

The invention will be more fully understood by reference to the following examples.

EXAMPLE 1

Figure 1:
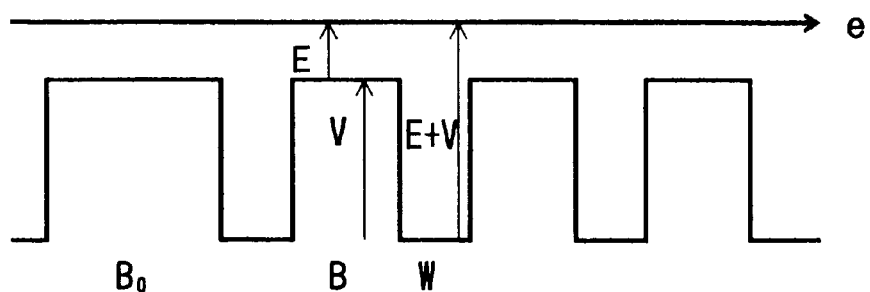
FIG. 1 is an explanatory view of a conduction band of a multi-layer structure according to the first to fourth aspects of the present invention.
Figure 2:
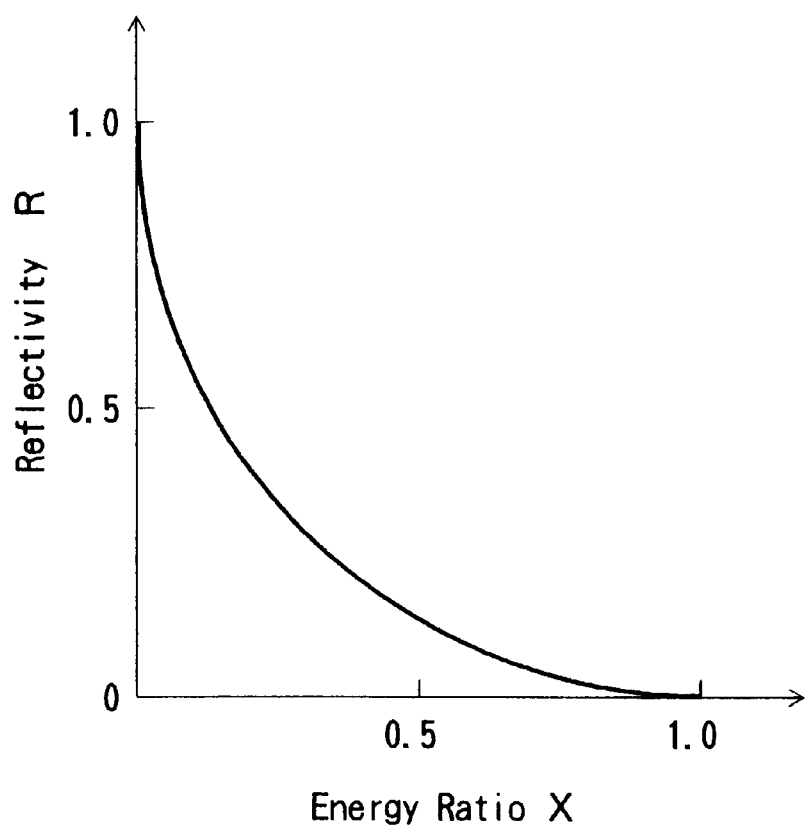
FIG. 2 is a graph showing a relation between an energy ratio x and a reflectivity R.
Figure 3:
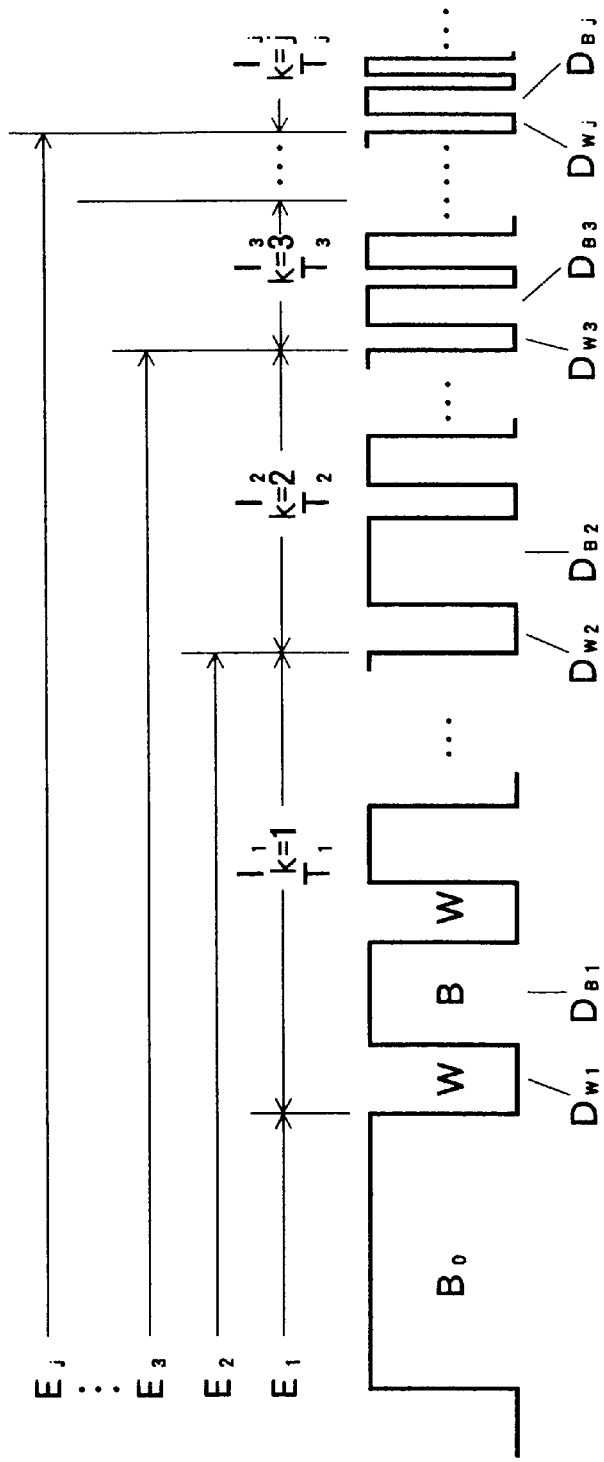
FIG. 3 is an explanatory view of partial quantum-wave interference layers $I_k$ according to the fifth aspect of the present invention.
Figure 4:
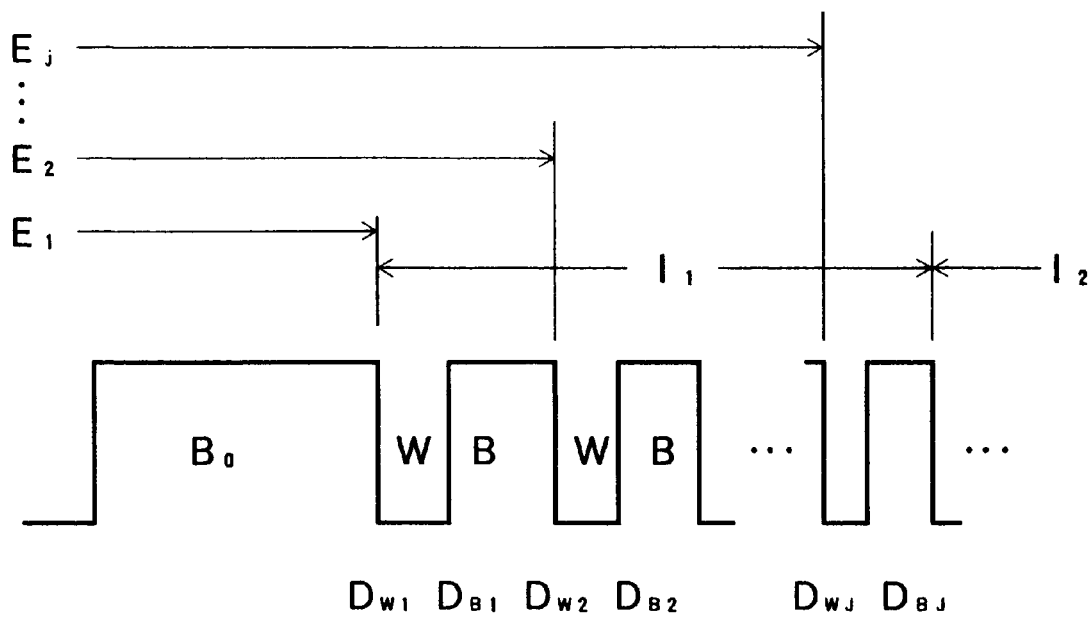
FIG. 4 is an explanatory view of partial quantum-wave interference layers $I_k$ according to the sixth aspect of the present invention.
Figure 5A:
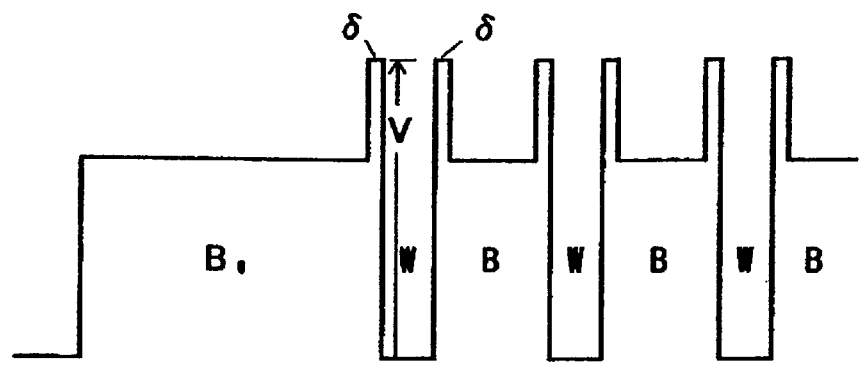
FIGS. 5A–5D are explanatory views of δ layers according to the seventh aspect of the present invention.
Figure 5B:
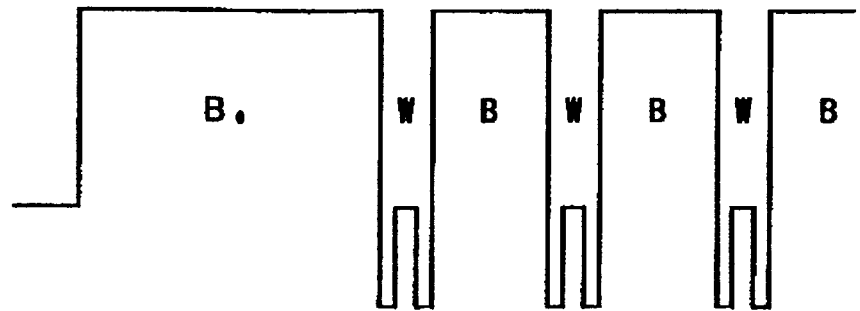
Figure 5C:
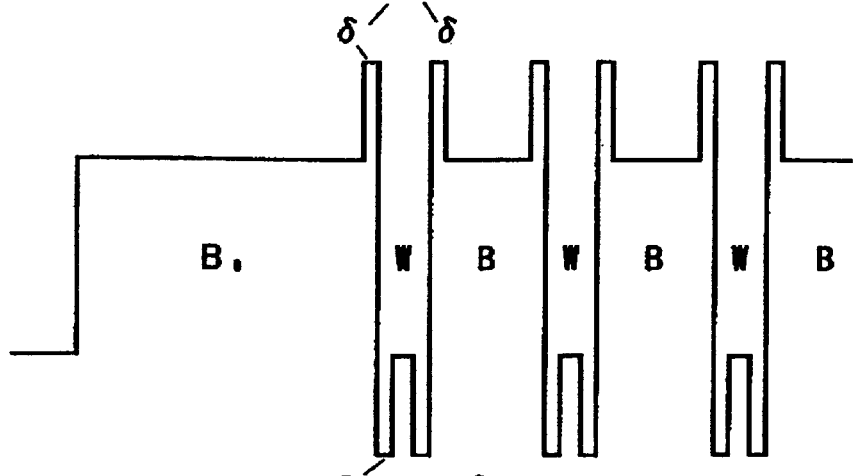
Figure 5D:
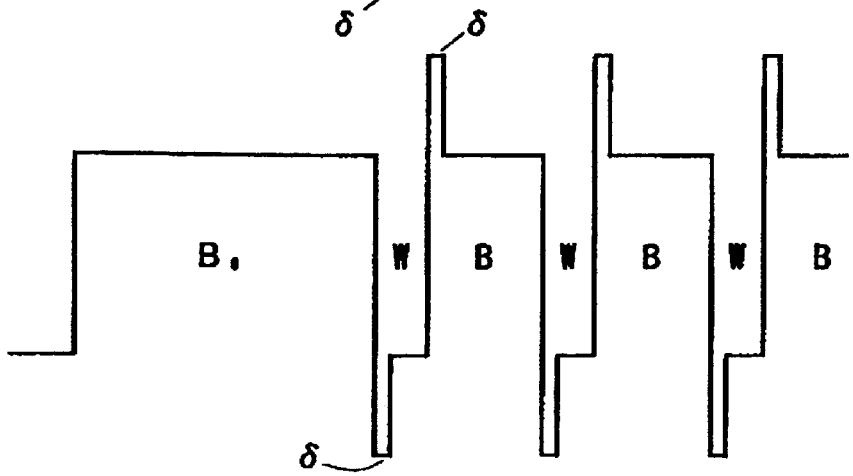
Figure 6A:
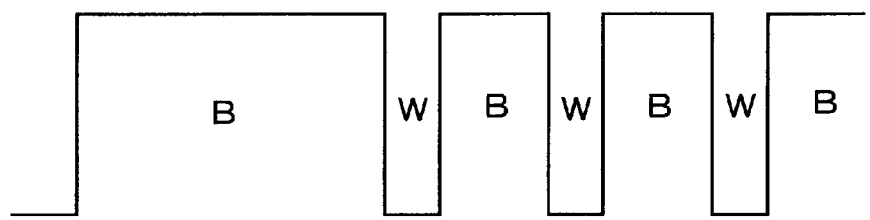
FIGS. 6A–6D are views showing energy level according to the seventh aspect of the present invention.
Figure 6B:
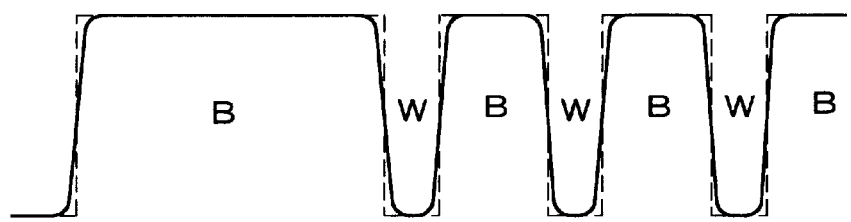
Figure 6C:
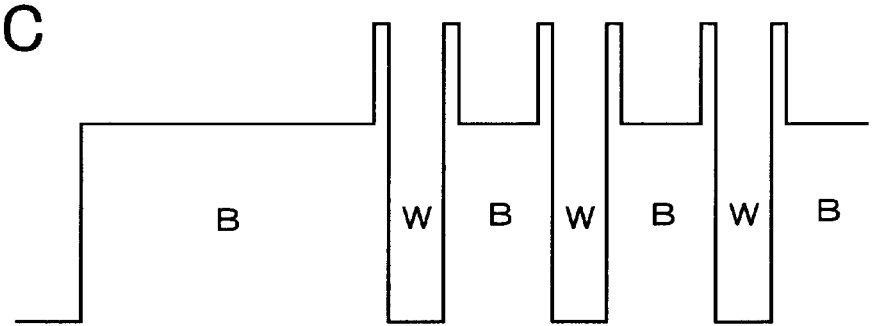
Figure 6D:
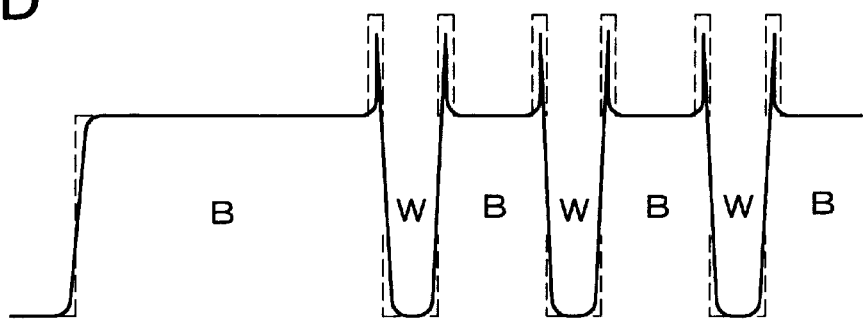
Figure 7:
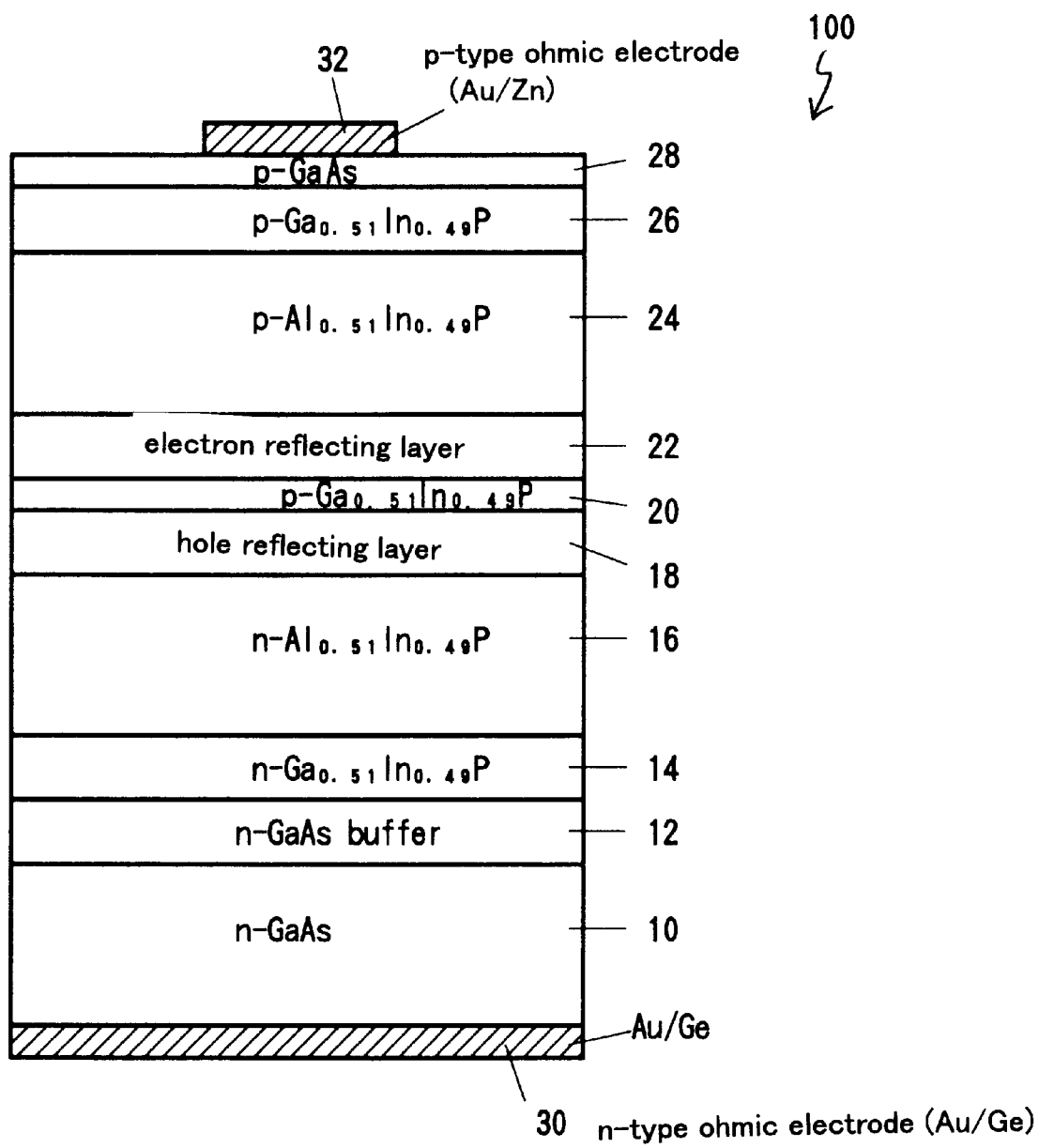
FIG. 7 is a sectional view showing a first exemplary structure of a light-emitting diode 100 in Example 1.

FIG. 7 is a sectional view of a light-emitting diode (LED) 100 in which an electron reflecting layer, or the first quantum-wave interference layer, is formed in a p-layer and a hole reflecting layer, i.e., the second quantum-wave interference layer, is formed in the adjacent layer, i.e., an n-layer, to an emission layer. The LED 100 has a substrate 10 made of gallium arsenide (GaAs). An n-GaAs buffer layer 12 having a thickness generally of 0.3 $\mu$m and an electron concentration of $2\times10^{18}/cm^3$ is formed on the substrate 10. An n-$Ga_{0.51}In_{0.49}P$ contact layer 14 of n-type conduction, having a thickness generally of 0.3 $\mu$m and electron concentration of $2\times10^{18}/cm^3$, is formed on the buffer layer 12. An n-$Al_{0.51}In_{0.49}P$ cladding layer 16 of n-type conduction, having a thickness generally of 1 $\mu$m and an electron concentration of $1\times10^{18}/cm^3$, is formed on the n-contact layer 14. A hole reflecting layer 18, or the second quantum-wave interference layer, is formed on the n-cladding layer 16. A p-$Ga_{0.51}In_{0.49}P$ emission layer 20 having a thickness generally of 14 nm is formed on the hole reflecting layer 18. An electron reflecting layer 22, or the first quantum-wave interference layer is formed on the emission layer 20. A p-$Al_{0.51}In_{0.49}P$ cladding layer 24 of p-type conduction, having a thickness generally of 1 $\mu$m and a hole concentration of $1\times10^{18}/cm^3$, is formed on the electron reflecting layer 22. A p-$Ga_{0.51}In_{0.49}P$ second contact layer 26 of p-type conduction, having a thickness generally of 0.2 $\mu$m and a hole concentration of $2\times10^{18}/cm^3$, is formed on the p-type cladding layer 24. A p-GaAs first contact layer 28 of p-type conduction, having a thickness generally of 0.1 $\mu$m, is formed on the second p-type contact layer 26. An electrode layer 30 made of gold and germanium (Au/Ge), having a thickness generally of 0.2 $\mu$m, is formed so as to cover the entire back of the substrate 10. Another electrode layer 32 made of gold and zinc (Au/Zn), having a thickness generally of 0.2 $\mu$m, is formed on some portion of the first p-contact layer 28. The substrate 10 has a diameter of 2.0 inches and the normal direction of its main surface is offset toward the [011] axis by 15 degree from the (100) plane.

The LED 100 was manufactured by gas source molecular beam epitaxial deposition (GS-MBE), which is an epitaxial growth method performed under extremely a high vacuum condition. GS-MBE is different from a conventional MBE, which supplies group III and V elements both from the solid sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$. Alternatively, the LED 100 can be manufactured by metal organic chemical vapor deposition (MOCVD).

In the energy diagrams of FIGS. 8A and 8B, the hole reflecting layer 16, the emission layer 20, and the electron reflecting layer 22 are shown. FIG. 8A shows an energy level of conduction and valence bands on the condition that no external voltage is applied to the LED 100, and FIG. 8B shows the energy level on the condition that the external voltage is applied thereto. The electron reflecting layer 22, or the first quantum-wave interference layer, has a multi-quantum layer structure with 15 periods of a p-$Ga_{0.51}In_{0.49}P$ well layer as a first layer W and a p-$Al_{0.51}In_{0.49}P$ barrier layer as a second layer B. A $\delta$ layer made of p-$Al_{0.33}Ga_{0.33}In_{0.33}P$ is formed at each interface between the first layer W and the second layer B. Thicknesses of the first layer W and the second layer B are respectively determined according to Eqs. 1 and 2. Only the first second layer $B_0$ is designed to have enough thickness to prevent conduction of carriers by tunneling effects. The $\delta$ layer is formed to have a thickness of 1.3 nm.

Accordingly, electrons injected from the n-type cladding layer 16 into the emission layer 20 are reflected effectively by the electron reflecting layer 22 and confined into the emission layer 20.

Although the valence band of the electron reflecting layer 22, or the first quantum-wave interference layer, also has a multiple period of energy level, holes are designed not to be reflected thereby. The respective thickness of the first layer W and the second layer B in the electron reflecting layer 22 is designed to reflect electrons only. Therefore, holes injected from the p-type cladding layer 24 pass through the electron reflecting layer 22 thus reaching the emission layer 20 easily and being confined therein by the hole reflecting layer 18.

As shown in FIG. 8A, a hole reflecting layer 18 is formed in the n-cladding layer 16 adjacent to the emission layer 20. The hole reflecting layer 18 has the same structure as that of the electron reflecting layer 22. FIG. 8A shows an energy diagram of the hole reflecting layer 18. To reflect holes effectively, the first layer W and the second layer B have thicknesses of 1.0 nm and 1.2 nm, respectively. Accordingly, by forming the electron reflecting layer 22 and the hole reflecting layer 18, a luminous output of the LED 100 was measured to be eightfold compared to that of an LED having no electron reflecting layer and hole reflecting layer and having a non-doped emission layer of i-type conduction.

Figure 9:
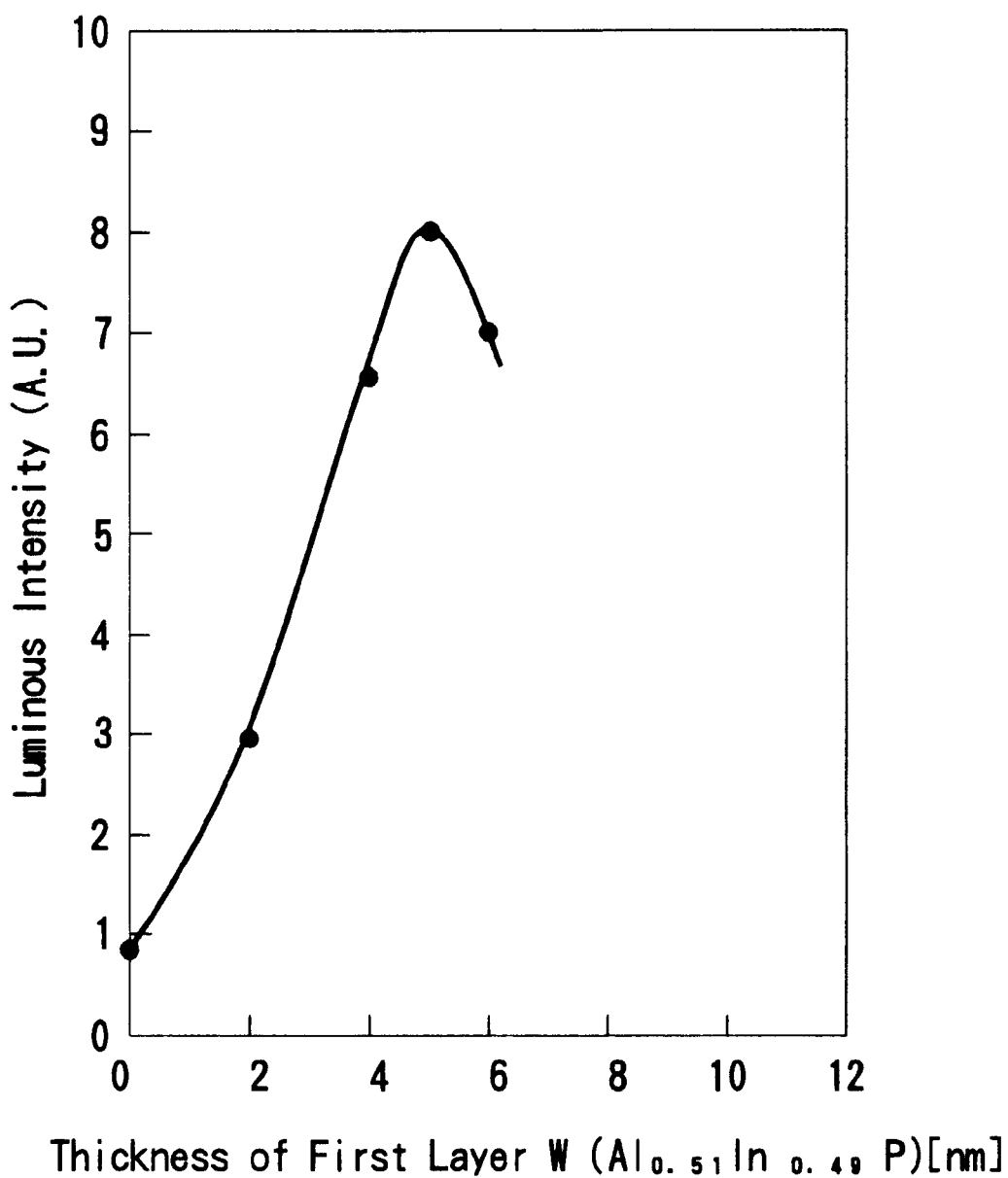
FIG. 9 is a graph showing a relationship between thickness of the first layer W of an electron reflecting layer and luminous intensity in Example 1.
Figure 10:
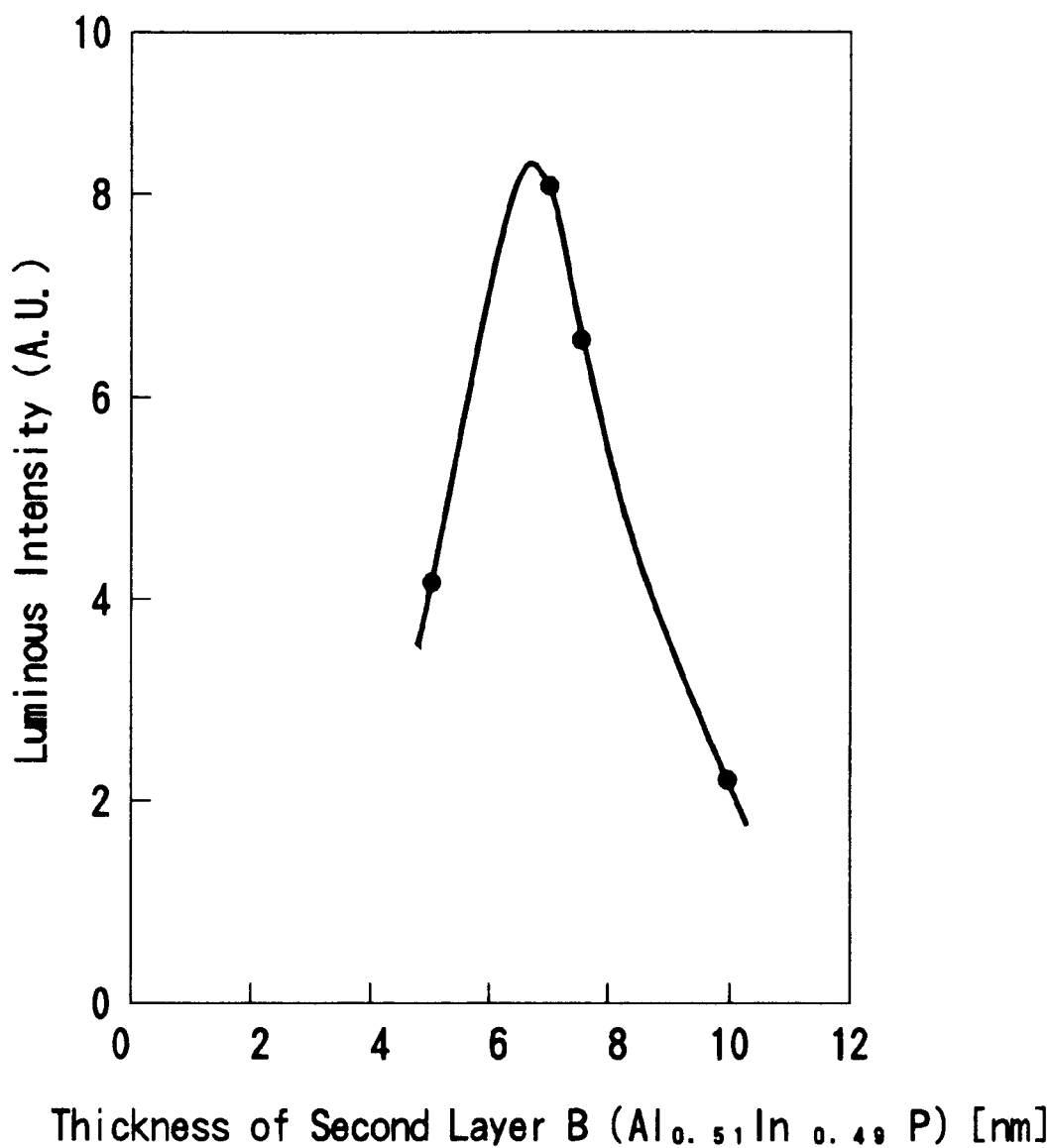
FIG. 10 is a graph showing the relationship between thickness of the second layer B of the electron reflecting layer and luminous intensity in Example 1.

Luminous intensity was measured by fixing the respective thickness of the first layer W and the second layer B in the hole reflecting layer 18 and varying the respective thickness of the first layer W and the second layer B of the electron reflecting layer 22. FIG. 9 shows a result when the thickness of the second layer B of the electron reflecting layer 22 was fixed at 7 nm and that of the first layer W of the electron reflecting layer 22 was varied. As shown in FIG. 9, a peak of luminous intensity was obtained when the thickness of the first layer W was 5 nm. Then, luminous intensity was measured fixing the thickness of the first layer W at 5 nm and varying that of the second layer B, the result being shown in FIG. 10. When the second layer B has a thickness of 7 nm, luminous intensity showed its peak. As a result, the LED with the electron reflecting layer 22 was found to have a maximum luminous intensity when the first layer W had a thickness of 5 nm and the second layer B had a thickness of 7 nm.

EXAMPLE 2

Figure 11:
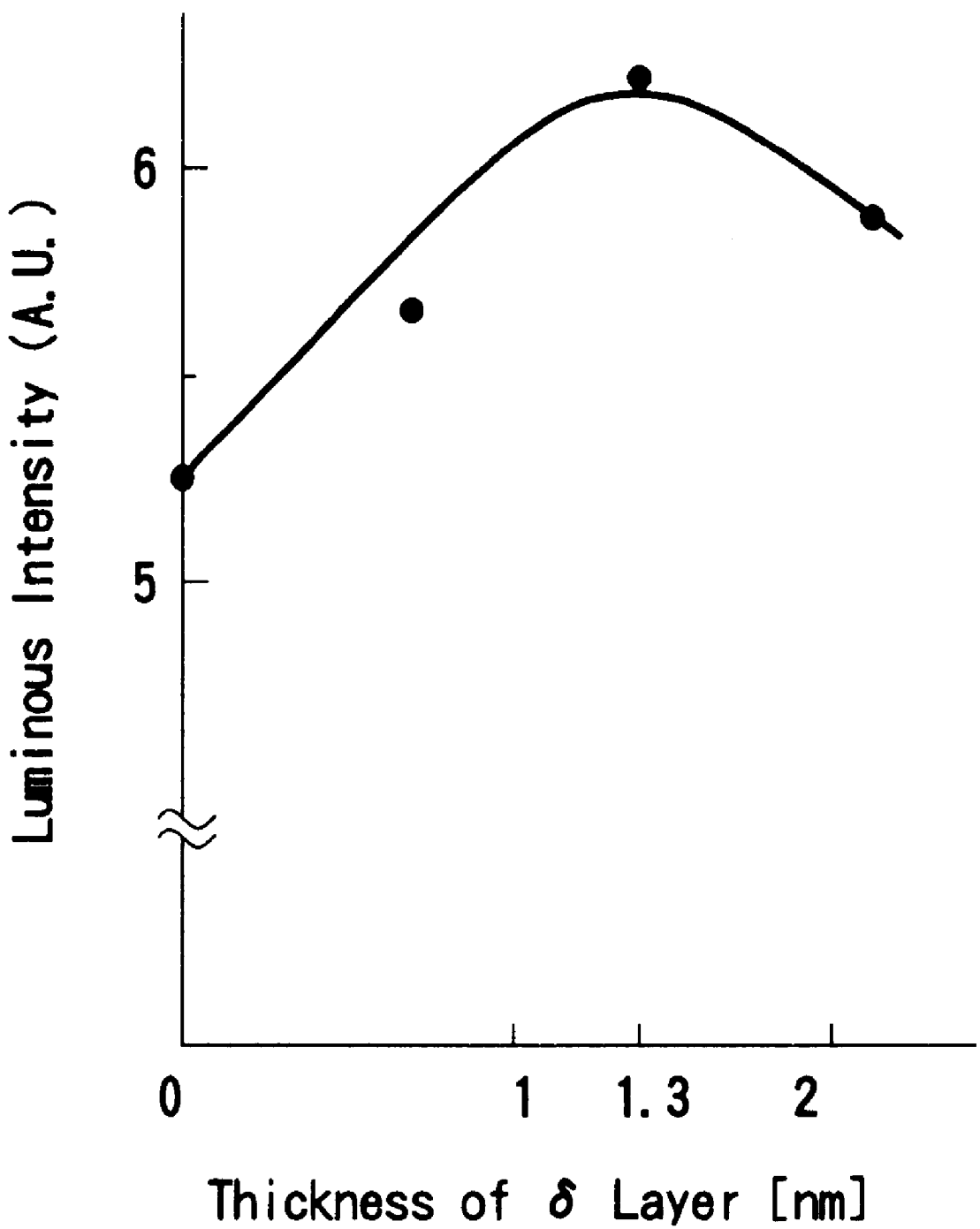
FIG. 11 is a graph showing the relationship between thickness of a δ layer and luminous intensity of the LED 200 in Example 2.

In this embodiment, an LED 200 has a structure as same as that of the LED 100 of FIG. 7. A thickness of the $\delta$ layer in the electron reflecting layer 22 is varied in many samples and a measured luminous intensity of the LED for the various thicknesses is shown in FIG. 11. The luminous intensity reaches its peak when the thickness of the $\delta$ layer is about 1.3 nm. The obtained luminous intensity of the LED 200 was 1.5 fold of that of an LED without the $\delta$ layer.

In the embodiments, an LED having a pn junction structure is shown. But a point of the present invention is that an electron reflecting layer and a hole reflecting layer are formed sandwiching emission layer, and the electron reflecting layer and the emission layer are formed in a p-layer, and the hole reflecting layer is formed adjacent to the emission layer. Therefore, the LED of the present invention is applied to an LED having other structure if only it comprises this construction. For example, an LED having a pin junction structure in which an electron reflecting layer and an emission layer are formed in a p-layer and a hole reflecting layer is formed in an i-layer adjacent to the emission layer can be used alternatively. Further alternatively, an LED having a pn n or pp$^-$n junction structure in which an electron reflecting layer and an emission layer is formed in a p-layer and a hole reflecting layer is formed in an n$^-$-layer or a p$^-$-layer adjacent to the emission layer can be used.

In the embodiments, an electron reflecting layer and an emission layer and a hole reflecting layer are formed with contacting in series. Alternatively, any semiconductor layer may be formed between the electron reflecting layer and the emission layer or between the emission layer and the hole reflecting layer. Further alternatively, the emission layer can have a multi-quantum well (MQW) structure. In the embodiments, the emission layer has a double-hetero junction structure. Alternatively, the emission layer can have a homo junction structure.

In the embodiments, a quantum-wave interference layer is formed in the LED. Alternatively, a quantum-wave interference layer can be formed in a semiconductor laser.

Further, in Examples 1 and 2, the quantum-wave interference layer and the δ layer was made of ternary compounds including $Ga_{0.51}In_{0.49}P$ and $Al_{0.51}In_{0.49}P$, and quaternary compounds including $Al_{0.33}Ga_{0.33}In_{0.33}P$, respectively. Alternatively, the quantum-wave interference layer layer having a δ layer between each layers can be made of quaternary compounds such as $Al_xGa_yIn_{1-x-y}P$ or $Al_xGa_yIn_{1-x-y}As$. selecting arbitrary composition ratio within the range of $0 \leq x \leq 1$, $0 \leq y \leq 1$, and $0 \leq x+y \leq 1$.

As another alternative, the quantum-wave interference layer layer can be made of group III–V compound semiconductor, group II–VI compound semiconductors, Si and Ge, and semiconductors of other hetero-material. The desirable compositions are as follows. Each combinations is represented by a composition of a layer having a wide band width / a layer having a narrow band width // a substrate. And x and y are arbitrary values wherein $0 \leq x \leq 1$ and $0 \leq y \leq 1$, as long as they are not specified.

<1> $Al_xIn_{1-x}P$ / $Ga_yIn_{1-y}P$ // GaAs

<2> $Al_xGa_{1-x}As$ / GaAs // GaAs

<3> $Ga_xIn_{1-x}P$ / InP // InP

<4> $Ga_xIn_{1-x}P$ / $Ga_xIn_{1-x}As$ // GaAs

<5> AlAs / $Al_xGa_{1-x}As$ // GaAs ($0.8 \leq x \leq 0.9$)

<6> InP / $Ga_xIn_{1-x}As_yP_{1-y}$ // GaAs

<7> Si / $SiGe_x$ // arbitrary material ($0.1 \leq x \leq 0.3$)

<8> Si / $SiGe_xC_y$ // arbitrary material ($0.1 \leq x \leq 0.3$, $0 < y \leq 0.1$)

<9> $Al_{x1}Ga_{y1}In_{1-x1-y1}N$ / $Al_{x2}Ga_{y2}In_{1-x2-y2}N$ // Si, SiC, GaN, or sapphire ($0 \leq x_1, x_2, y_1, y_2, x_1+y_1, x_2+y_2 \leq 1$)

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Oct. 23, 1998, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:

a first and a second quantum-wave interference layers each having plural periods of a pair of a first layer and a second layer having a wider band gap than said first layer, each of said first and said second quantum-wave interference layers being formed on respective sides of an emission layer with p-type conduction; wherein each thickness of said first and said second layers of said first quantum-wave interference layer is equal to an odd number multiplied by one fourth of wavelength of quantum-wave of electrons in each of said first and second layers, and each thickness of said first and said second layers of said second quantum-wave interference layer is equal to an odd number multiplied by one fourth of wavelength of quantum-wave of holes in each of said first and said second layers, wherein with respect to said first and second quantum-wave interference layer, said wavelength $\lambda_W$ in said first layer is determined by a formula $\lambda_W = h/[2m_W(E+V)]^{1/2}$, said wavelength $\lambda_B$ in said second layer is determined by a formula $\lambda_B = h/(2m_BE)^{1/2}$, said thickness of said first layer $D_W$ is determined by a formula $D_W = n_W\lambda_W/4$, and said thickness of said second layer $D_B$ is determined by a formula $D_B = n_B\lambda_B/4$, where h, $m_W$, $m_B$, E, V, and $n_W$ and $n_B$ represent Plank's constant, an effective mass of said carrier in said first layer, an effective mass of said carrier in said second layer, a kinetic energy of carriers injected into said second layer, a potential energy of said second layer to said first layer, and odd number, respectively, and wherein $E \leq V/9$.

2. A light-emitting device according to claim 1, wherein electrons which determine thicknesses of said first and said second layers of said first quantum-wave interference layer exist around the lowest energy level of a conduction band in said second layer.

3. A light-emitting device according to claim 1, wherein holes which determine thicknesses of said first and said second layers of said second quantum-wave interference layer exist around the lowest energy level of a valence band in said second layer.

4. A light-emitting device according to claim 1, wherein a δ layer is formed between said first and said second layers of at least one of said first and said second quantum-wave interference layers for sharply varying energy band and has a thickness substantially thinner than said first and said second layers.

5. A light-emitting device according to claim 1, wherein said first quantum-wave interference layer functions as a reflecting layer for reflecting electrons, and said second quantum-wave interference layer functions as a reflecting layer for reflecting holes.

6. The light-emitting device according to claim 5, wherein said first quantum-wave interference layer is formed in a p-layer on one side of said emission layer, and said second quantum-wave interference layer is formed in a n-layer on another side of said emission layer.

7. A light-emitting device according to claim 1, further comprising:

a first non-tunneling layer composed of the same material as said second layer, said first non-tunneling layer being at an incident plane of quantum-wave in said first quantum-wave interference layer having enough thickness to prevent conduction of electrons by a tunneling effect, and a second non-tunneling layer composed of the same material as said second layer, said second non-tunneling layer being at an incident plane of quantum-wave in said second quantum-wave interference layer having enough thickness to prevent conduction of holes by a tunneling effect.

* * * * *